United States Patent
Mandelman et al.

(10) Patent No.: US 6,432,787 B1
(45) Date of Patent: Aug. 13, 2002

(54) METHOD AND APPARATUS FOR PROVIDING LOW-GIDL DUAL WORKFUNCTION GATE DOPING WITH BORDERLESS DIFFUSION CONTACT

(75) Inventors: Jack A. Mandelman, Stormville; Ramachandra Divakaruni, Middletown, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/982,822

(22) Filed: Oct. 22, 2001

Related U.S. Application Data

(62) Division of application No. 09/325,943, filed on Jun. 4, 1999.

(51) Int. Cl.[7] .................. H01L 21/336; H01L 21/8242
(52) U.S. Cl. .................. 438/305; 438/301; 438/241; 438/264
(58) Field of Search .................. 438/142, 153, 438/213, 216, 233, 241, 301, 305, 471, 275, 264

(56) References Cited

U.S. PATENT DOCUMENTS

| | | | |
|---|---|---|---|
| 5,213,990 A | | 5/1993 | Rodder |
| 5,424,572 A | | 6/1995 | Solheim |
| 5,589,415 A | | 12/1996 | Blanchard |
| 6,153,486 A | * | 11/2000 | Ibok .................. 438/301 |
| 6,171,959 B1 | * | 1/2001 | Nagabushnam .................. 438/471 |
| 6,200,834 B1 | * | 3/2001 | Bronner et al. .................. 438/142 |
| 6,235,584 B1 | * | 5/2001 | Sun et al. .................. 438/257 |
| 6,274,467 B1 | * | 8/2001 | Gambino et al. .................. 438/301 |
| 6,277,758 B1 | * | 8/2001 | Ko .................. 438/706 |
| 6,281,064 B1 | * | 8/2001 | Mandelman et al. .................. 438/233 |
| 6,281,084 B1 | * | 8/2001 | Akatsu et al. .................. 438/301 |
| 6,281,559 B1 | * | 8/2001 | Yu et al. .................. 257/407 |
| 6,284,633 B1 | * | 9/2001 | Nagabushnam et al. .................. 438/153 |
| 6,288,419 B1 | * | 9/2001 | Prall et al. .................. 257/213 |
| 6,326,260 B1 | * | 12/2001 | Divakaruni et al. .................. 438/241 |
| 6,333,244 B1 | * | 12/2001 | Yu .................. 257/410 |
| 6,337,246 B1 | * | 1/2002 | Sobek et al. .................. 438/264 |
| 6,342,452 B1 | * | 1/2002 | Coronel et al. .................. 438/532 |
| 6,346,442 B1 | * | 2/2002 | Aloni et al. .................. 438/216 |
| 6,362,055 B2 | * | 3/2002 | Lin et al. .................. 438/275 |

* cited by examiner

*Primary Examiner*—John F. Niebling
*Assistant Examiner*—Walter L. Lindsay, Jr.
(74) *Attorney, Agent, or Firm*—Todd M. C. Li; McGinn & Gibb

(57) ABSTRACT

A semiconductor structure is provided along with a corresponding method of producing such a structure. The method and structure may include providing a semiconductor substrate, a gate insulator over the semiconductor substrate, a conductor comprising intrinsic polysilicon over the gate insulator, a silicide layer over the polysilicon and an insulating cap over the silicide layer. Insulating spacers may be provided along sides of the silicide layer and the insulating cap. The polysilicon may be doped with a first conductive type dopant. The first conductive type dopant may be spread over the polysilicon to form a doped polysilicon layer. A gate sidewall layer may be formed on sides of the doped polysilicon layer. A bird's beak of the gate sidewall layer may also be formed in a corner of the polysilicon.

20 Claims, 11 Drawing Sheets

METHOD AND APPARATUS FOR PROVIDING LOW-GIDL DUAL WORKFUNCTION GATE DOPING WITH BORDERLESS DIFFUSION CONTACT

This application is related to the following U.S. patent applications filed on Jun. 4, 1999: "MODIFIED GATE CONDUCTOR PROCESSING FOR POLY LENGTH CONTROL IN HIGH DENSITY DRAMs", Ser. No. 09/325,942 (IBM Docket No. F19-99-044) and "METHOD FOR PROVIDING DUAL WORKFUNCTION DOPING AND PROTECTIVE INSULATING CAP", Ser. No. 09/325,941 (IBM Docket No. F19-99-046), both of which are incorporated herein by reference.

The present Application is a Divisional Application of U.S. patent application Ser. No. 09/325,943, filed on Jun. 4, 1999.

BACKGROUND OF THE INVENTION

1. Field of the Invention

The present invention generally relates to a method and apparatus that provides dual work function doping and an insulating gate conductor cap that minimizes gate induced drain leakage (GIDL).

2. Description of the Related Art

Over the last several years, significant advances have occurred in increasing the circuit density in integrated circuit chip technology. The ability to provide significantly increased numbers of devices and circuits on an integrated circuit chip has, in turn, created an increased desire to incorporate or integrate additional system functions onto a single integrated circuit chip. In particular, an increasing need exists for joining both memory circuits and logic circuits together on the same integrated circuit chip.

In fabricating dynamic random access memory (DRAM) circuits, the emphasis has been on circuit density along with reduced cost. On the other hand, when fabricating logic circuits, the emphasis has been on creating circuits that operate faster. Accordingly, this desire for dual work function creates additional problems with respect to the complexity and relative cost of the fabricating process. For instance, memory circuits achieve increased density requirements by employing self-aligned contacts (borderless bit line contacts), which are easily implemented in a process having a single type (e.g. typically N+ type) gate work function. A buried-channel P-type metal oxide semiconductor (PMOSFET) is used in creating DRAMs since such permits a single work function gate conductor, N+, to be used throughout the fabrication process. This results in significant cost savings in fabricating DRAMs, but at the expense of creating an inferior performing PMOSFET. On the other hand, logic circuits require both P+ and N+ gated MOSFETs in order to achieve the necessary switching speeds. P+ and N+ gate conductor devices are highly desirable for merged logic and DRAM products.

High-performance logic requires the use of both N+ and P+ doped gate conductors. Although currently practiced high-performance logic processes provide dual workfunction gate conductors, they do not use an insulating gate cap because of density requirements, and hence the need for diffusion contacts borderless to gate conductors, which are of secondary importance to speed. In DRAMs, an insulating cap which is self-aligned to the gate conductor is essential for forming bitline contacts which are borderless to the wordlines. Borderless contacts are needed for achieving the highest density memory cell layouts. However, cost-effective DRAM processes use only a single N+ polysilicon gate conductor. Thus, there is currently no economically attractive process for providing both dual workfunction gate doping and the capability of borderless diffusion contacts.

Furthermore, array device scaling problems (i.e., high well doping that results in high junction leakage and reliability constraints on the maximum wordline boost voltage) makes use of negative wordline-low designs inevitable. Although negative wordline-low designs result in significantly reduced junction area and perimeter leakage and leakage in the depletion region under the gate, gate induced drain leakage (GIDL) is a concern. As is well known in the art, GIDL occurs in the surface depletion region where the wordline overlaps the storage node diffusion and is driven by the field which results from the potential difference between the gate and the diffusion region. Negative wordline-low increases this potential difference. Hence, a method is needed to independently control the thickness of the array region's gate insulator where the gate overlaps the diffusion region without significantly increasing the gate insulator thickness.

SUMMARY OF THE INVENTION

In view of the foregoing and other problems of the conventional techniques, an object of the present invention is to provide dual workfunction doping gate conductors with self-aligned insulating gate cap that reduces GIDL.

It is another object of the present invention to provide a method for producing a semiconductor structure. The method may include providing a semiconductor substrate, a gate insulator over the semiconductor substrate, a conductor comprising intrinsic polysilicon over the gate insulator, a silicide layer over the polysilicon and an insulating cap over the silicide layer. Insulating spacers (silicon nitride) may be provided along sides of the silicide layer and the insulating cap. Portions of the intrinsic polysilicon may be doped with a first conductive type dopant such as N+-type. The first conductive type dopant may then be spread over the polysilicon to form a first doped polysilicon layer. A gate sidewall layer may be formed on sides of the doped polysilicon layer and includes a bird's beak of the gate sidewall layer.

Portions of the doped polysilicon may be etched after spreading the first conductive type dopant over the polysilicon. Other portions of the semiconductor structure may be covered with a block mask during etching the portion of the polysilicon.

It is another object of the present invention to provide a semiconductor structure that includes a semiconductor substrate, a first gate insulator provided over the semiconductor substrate, a first doped polysilicon layer provided over portions of the gate insulator, a first silicide layer provided over the first doped polysilicon layer, a first insulating cap provided over the first silicide layer, and a gate sidewall layer formed on sides of the first doped polysilicon layer. The gate sidewall layer may have a bird's beak formed at a corner position of the first doped polysilicon layer.

Still another object of the invention is to selectively provide shallow source-drain diffusions (i.e., for the support MOSFETs), whose depth is decoupled from the thermal budget associated with the formation of the bird's beak.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1:
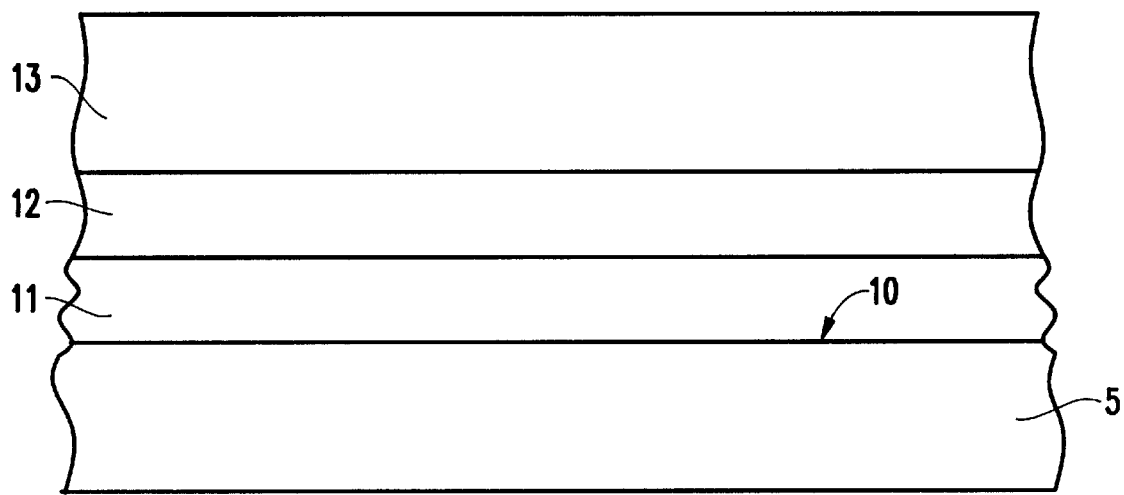
FIG. 1 shows an initial semiconductor structure.
Figure 2:
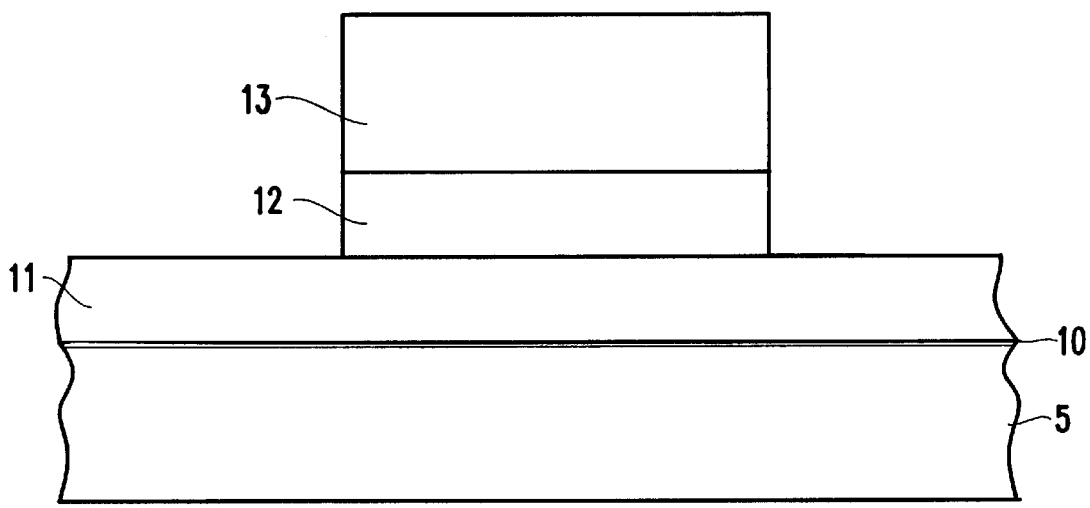
FIG. 2 shows the FIG. 1 semiconductor structure after etching.

FIGS. 1 and 2 will now be described with respect to forming a partial gate conductor stack. Following that discussion, the figures will be divided to show the gate conductor stack in support regions and array regions of the semiconductor structure.

FIG. 1 shows a semiconductor substrate 5 which is initially provided and a gate oxide layer 10 provided over the substrate 5. The semiconductor substrate 5 is typically silicon but can be any semiconductor material such as group II–VI semiconductors, group III–V semiconductors, or a composite silicon semiconductor such as silicon carbide. The semiconductor substrate 5 typically contains isolation and well doping regions which have been implanted prior to the formation of the overlying layers. Further, a nitride or oxygen nitride gate insulator may be used rather than the gate oxide layer 10.

A gate stack is deposited over the substrate 5 and the gate oxide layer 10. The gate stack may include an intrinsic (i.e., undoped) polysilicon layer 11, a tungsten silicide ($WSi_x$) layer 12, and a silicon nitride layer acting as a nitride cap 13.

A gate conductor (GC) mask, such as a layer of resist material (not shown) of the type employed in known lithographic masking and etching techniques is placed over the nitride cap 13. Any well-known photosensitive polymerizable resist materials may be used. The resist material may be applied by spinning or by spraying, for example. The gate stack is patterned and etched through the nitride cap 13 and the $WSi_x$ layer 12 down to the polysilicon layer 11 as shown in FIG. 2. Overetching into the polysilicon layer 11 is acceptable.

As is known in the art, the semiconductor structure may include array regions and support regions. The following discussion regarding FIGS. 3A–11B contains different processes between the support region and the array region. Since the layout in the array region requires the utmost density, minimum channel length (i.e., minimum polysilicon gate conductor stack width) and minimum space between the gate conductors is utilized. In the array region, a minimum space between gate conductors requires that diffusion contacts be borderless to the array gate conductors (wordlines). Borderless contact technology is most compatible and least expensive for single workfunction gate conductors (i.e., preferably N+).

Since density requirements in the support regions are more relaxed than in the array region, borderless diffusion contacts and gate conductors with insulating caps are not required. However, dual workfunction gate conductors in the support region are desired for improved performance. In the following discussion, each of FIGS. 3A, 4A, 5A, 6A, 7A, 8A, 9A, 10A and 11A show the structure in the array region and each of FIGS. 3B, 4B, 5B, 6B, 7B, 8B, 9B, 10B and 11B show the structure in the support region.

Figure 3A:
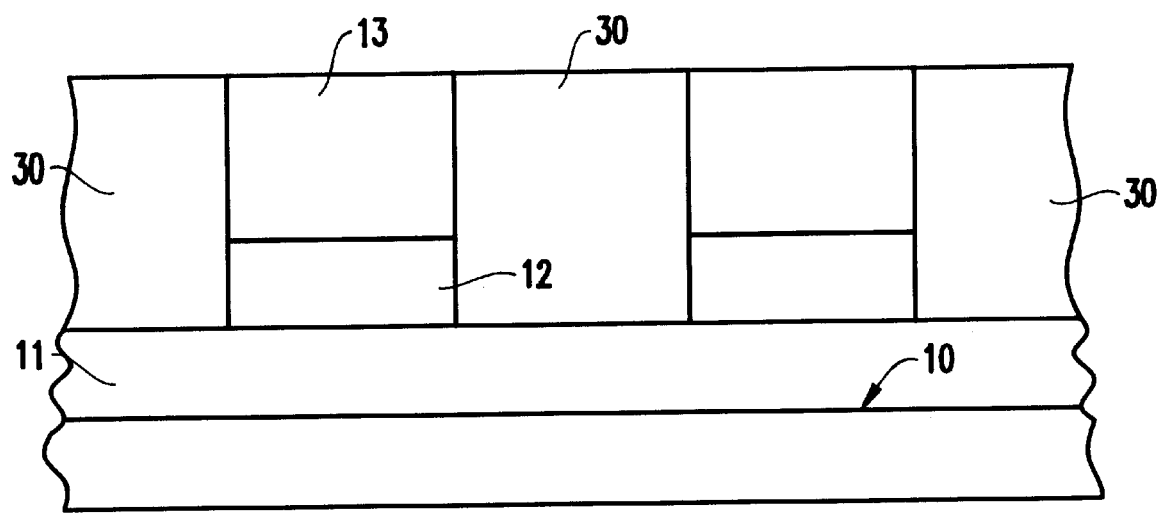
FIGS. 3A and 3B show the semiconductor structure after depositing and anisotropically etching spacer material.
Figure 3B:
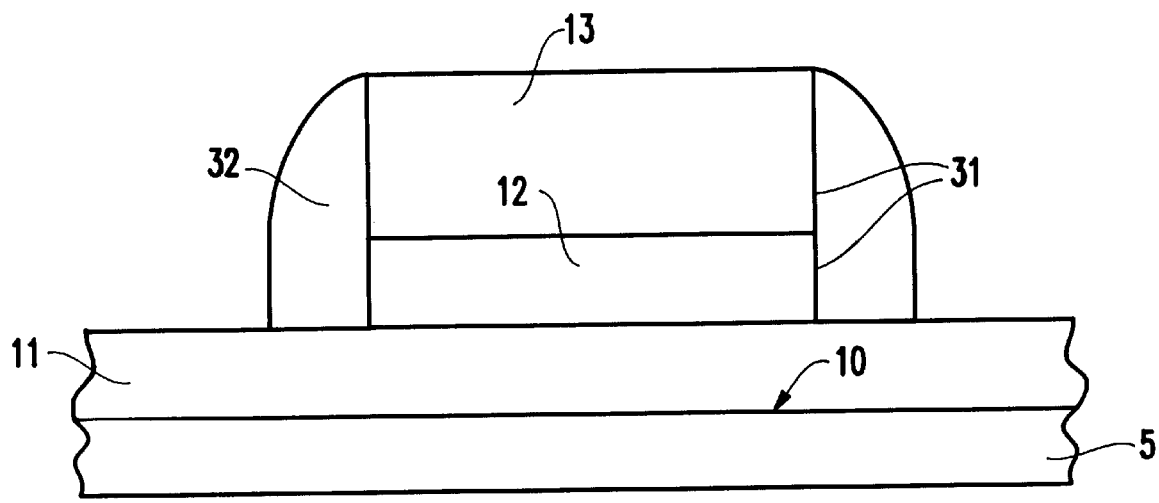
Figure 4A:
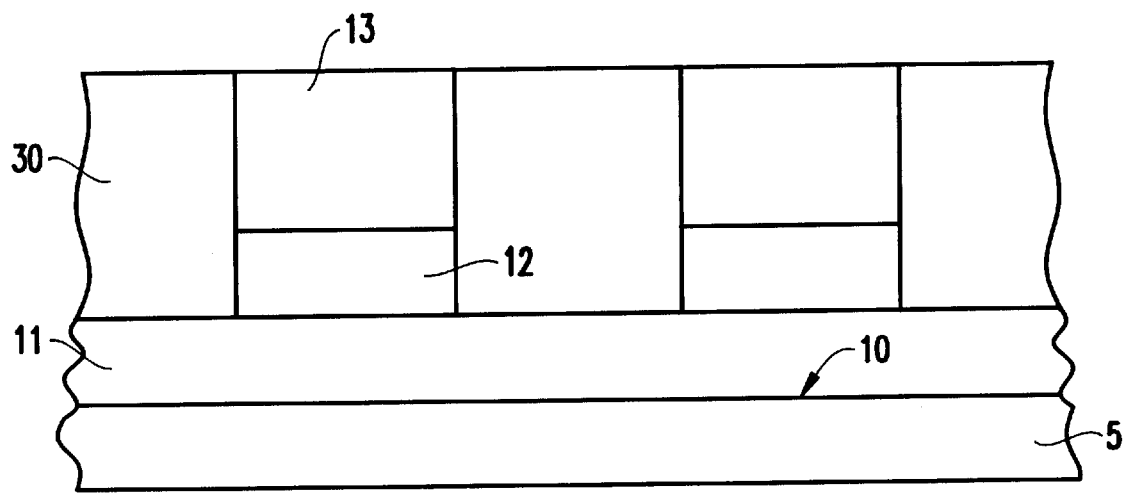
FIGS. 4A and 4B show the semiconductor structure after etching the exposed polysilicon layer.
Figure 4B:
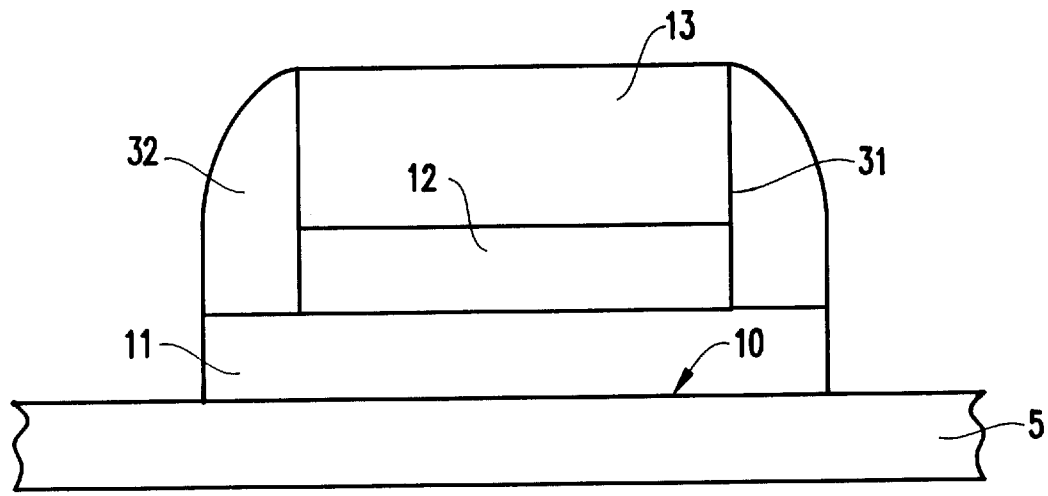

As shown in FIG. 3, a layer of boron silicate glass (BSG) 30 may be conformally deposited over the partially patterned gate stacks. The BSG 30 thickness is selected such that the narrow spaces between gate conductors (wordlines) in the array region (FIG. 3A) are completely filled while the wider spaces in the support region (FIG. 3B) contain the topography of the conformal layer of the BSG 30 (FIG. 3B). In an exemplary case, for a 150 nm minimum feature size, the spacing between gate conductors in the array region (FIG. 3A) is nominally approximately 150 nm, whereas the spacing between gate conductors in the support region (FIG. 3B) is typically 300 nm or greater. A BSG layer 30 thickness of between approximately 80 nm and 140 nm is preferably used.

The deposited BSG 30 is then reactive ion etched (RIE'd) selectively to the silicon nitride, forming spacers 32 on the gate sidewalls 31 in the support region (FIG. 3B), but leaving the spaces filled in with the BSG 30 in the array region (FIG. 3A). The BSG 30 in the array region (FIG. 3A) acts as a blocking layer. In an alternative embodiment, if borderless contacts are adopted in the support region or minimum space is used between support gates, then a simple block mask may be used (rather than a BSG blocking layer) to protect the array region while the BSG spacers 32 are formed in the support region.

In the support region, the exposed intrinsic polysilicon layer 11 of the gate stack is reactive ion etched (RIE'd) selectively to oxide and nitride, stopping on the gate oxide layer 10 over the substrate 5. Because of the spacers 32 in the support region (FIG. 4B) and the protective BSG 30 (i.e., blocking layer) filling the gaps between gate conductors in the array region (FIG. 4A), only the gate polysilicon layer 11 of the support region is opened by the reactive ion etching process.

Figure 5A:
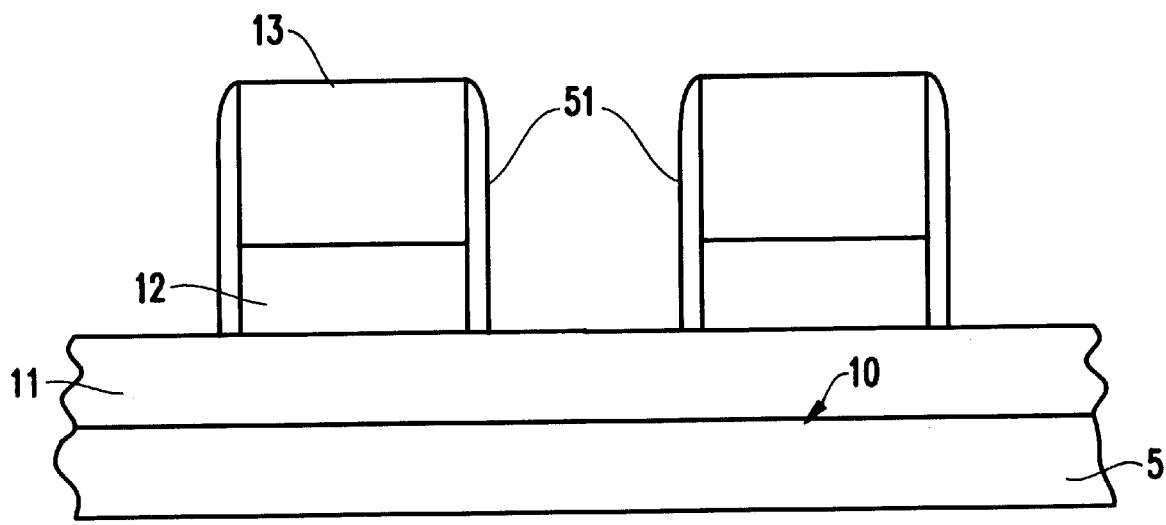
FIGS. 5A and 5B show the semiconductor structure after applying a nitride layer.
Figure 5B:
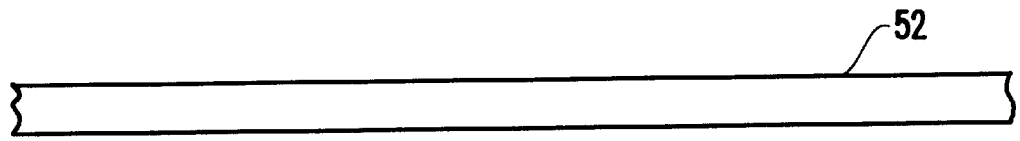
Figure 5B:
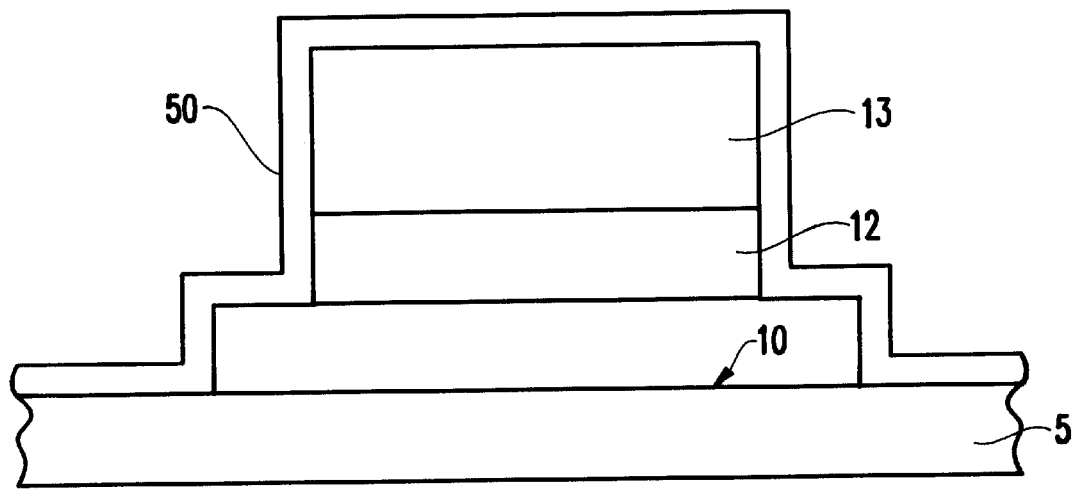

The BSG 30 is then removed (i.e., the spacers 32 from the support region and the blocking layer from array region) selectively to nitride, thermal oxide and polysilicon using well known etching techniques such as HF/sulphuric wet etching. Then, a thin (e.g., approximately 20 nm) conformal silicon nitride layer is deposited over the semiconductor structure. This forms a nitride layer 50 in the support region (FIG. 5B). A block mask 52 may then be selectively placed over the support region so that the exposed silicon nitride layer in the array region may be reactive ion etched to form the spacers 51 (FIG. 5A). The block mask 52 protects the support region from etching and is removed following the etching.

Figure 6A:
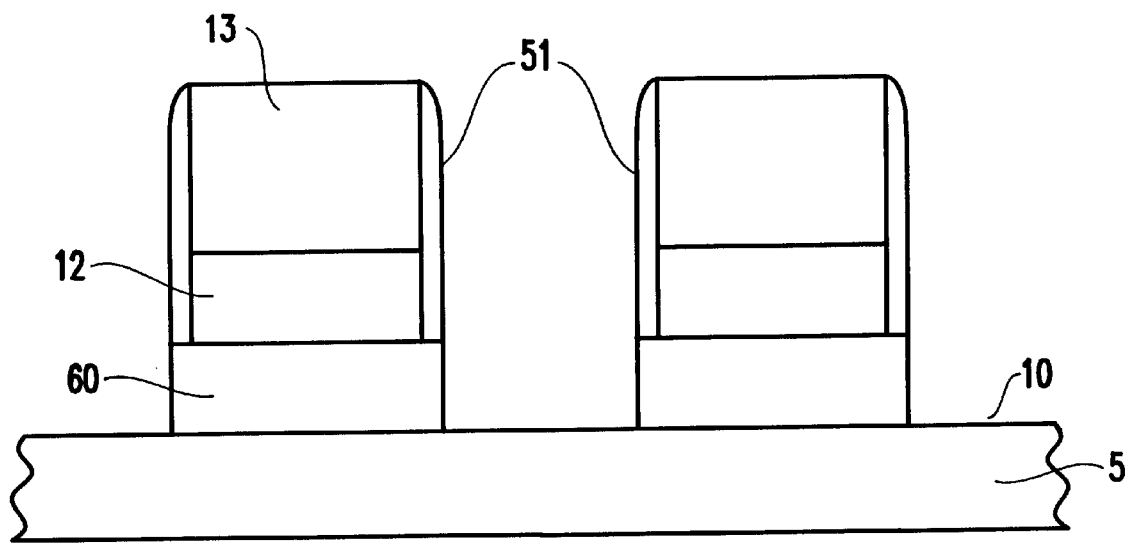
FIGS. 6A and 6B show the semiconductor structure after etching the exposed polysilicon layer.
Figure 6B:
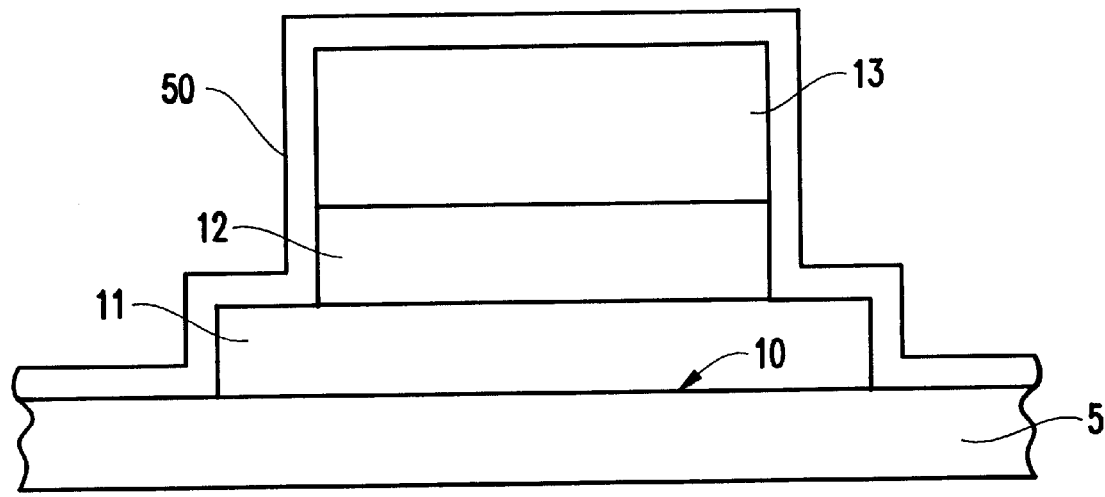

N+ dopant is then implanted into exposed surfaces of the polysilicon layer 11, which should only be in the array region. In the support region (FIG. 6B), the silicon nitride barrier 50 protects the polysilicon layer 11 from significant doping. Accordingly, the dopant is implanted into the polysilicon of the array region (FIG. 6A) and is then diffused throughout the gate conductor using a rapid thermal anneal (RTA) to form a doped polysilicon layer 60 in the array region (FIG. 6A). The energy of the N+ implant is selected such that the amount of dopant penetrating through the array region's gate polysilicon layer into the substrate 5 is negligible. The exposed polysilicon layer 60 is reactive ion etched selectively to oxide and nitride, stopping on the gate oxide layer 10 (FIG. 6A).

Figure 7A:
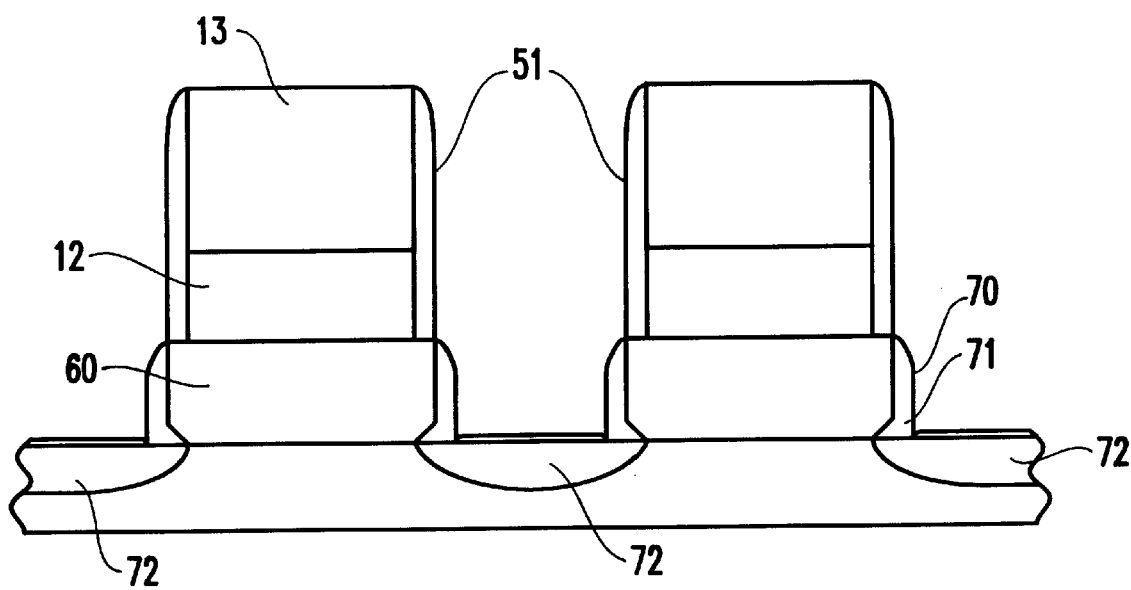
FIGS. 7A and 7B show the semiconductor structure after a first source-drain doping and selective formation of bird's beak.
Figure 7B:
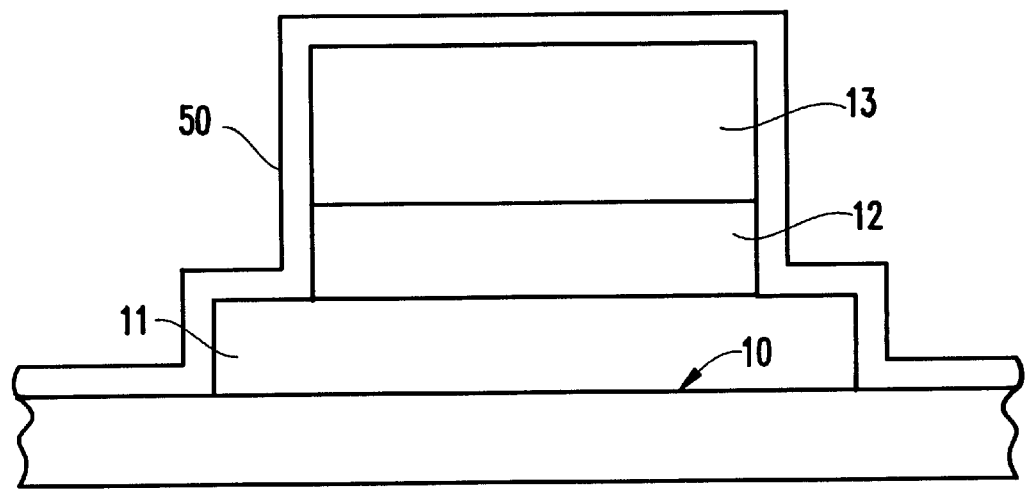

Then, as shown in FIG. 7A, a gate sidewall oxide layer 70 is grown along edges of the doped polysilicon layer 60 in the array region (FIG. 7A). Oxidation conditions are tailored to form the bird's beak 71 under the edge of the gate conductor. The bird's beak is typically formed such that it extends to, but not beyond, the metallurgical junction of the source-drain diffusion. The lateral extent of the bird's beak under the edge of the gate conductor typically ranges from 3 to 30 nm. The thick oxide region of the sidewall oxide layer 70 and the bird's beak 71 reduces the electric field strength responsible for causing the gate induced drain leakage (GIDL). For the GIDL mechanism, the generation rate of electron-hole pairs in the drain depletion region under the gate edge is an exponential function of the electric field strength in the silicon. The array region's N+ source-drain extensions 72 are then implanted (FIG. 7A) typically at a low dose ($2 \times 10^{13}$–$2 \times 10^{14}$ cm$^{-2}$). The silicon nitride layer 50 blocks the N+ dopant from the support region (FIG. 7B). During the gate sidewall oxidation, care is exercised so that the gate oxide beyond the edge of the N+ junction is not significantly thickened.

Figure 8A:
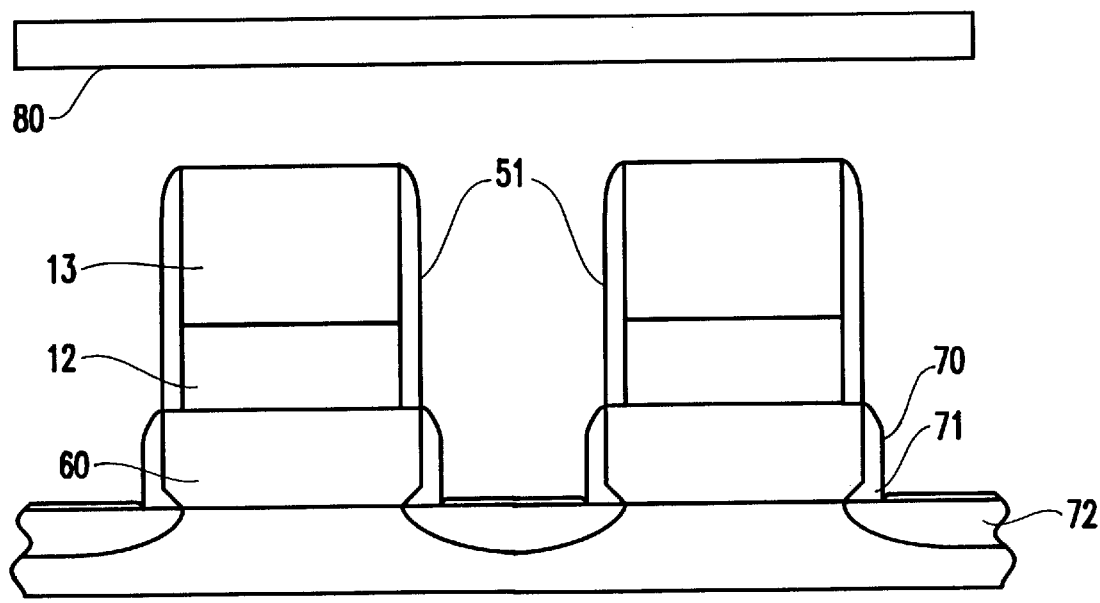
FIGS. 8A and 8B show the semiconductor structure after a second source-drain doping.
Figure 8B:
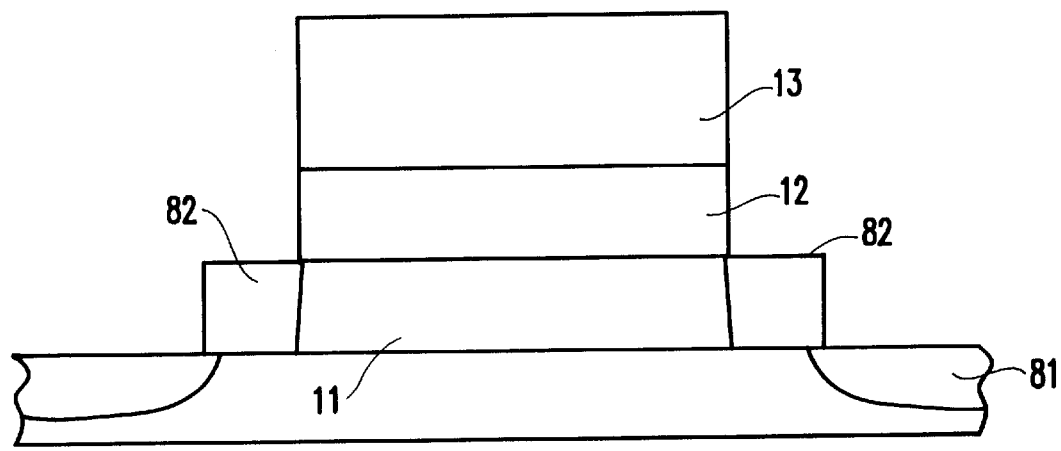

A block mask 80 may then be selectively placed over the array region (FIG. 8A) to protect the array gates from damage during removal of the silicon nitride layer 50 in the support region (FIG. 8B). The block mask 80 also protects the nitride spacers 51 in the array region, which prevent the array region's gate conductor from being doped by the subsequent support region's implants. That is, masked ion implants are used to introduce N+ dopant (e.g., As or Phos) into the gate polysilicon layer 11 of the support region's NFETs (i.e., in the exposed ledges 82) and into the source-drain region of the support region's NFETs. Likewise, the support region's PFETs receive a P-type dopant implant (typically boron) into the gate polysilicon layer and the source-drain regions.

Figure 9A:
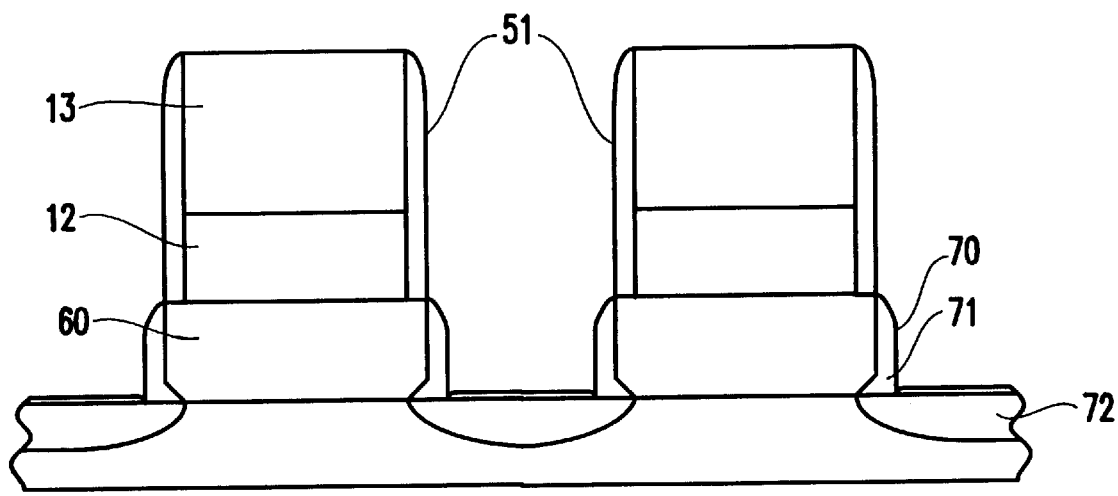
FIGS. 9A and 9B show the semiconductor structure after annealing.
Figure 9B:
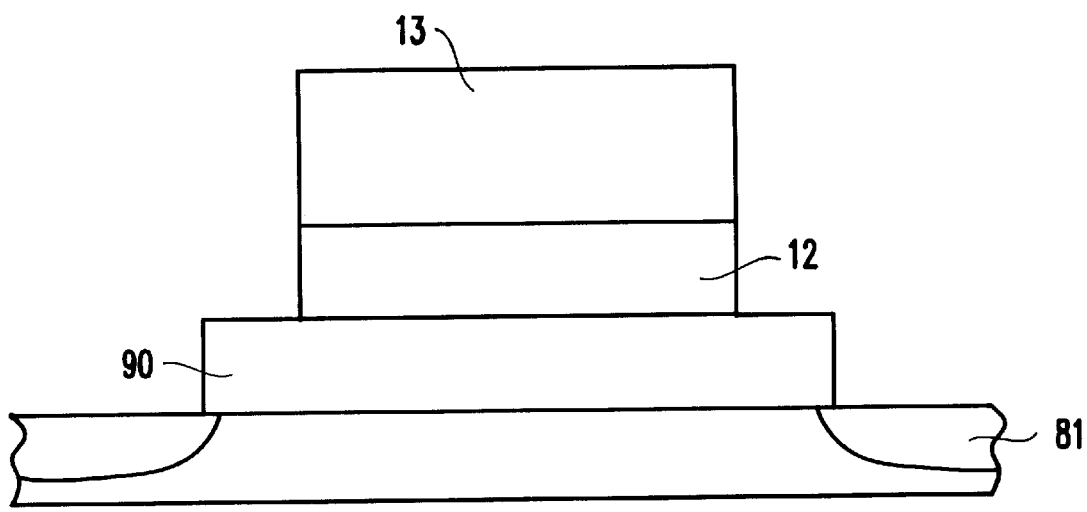

The blocking mask 80 is then removed from the array region and a rapid thermal anneal is used to distribute the dopants throughout the lateral extent of the gate polysilicon layer 11 and form a doped polysilicon layer 90 (FIG. 9B). Since the diffusivity of dopant in polysilicon is typically one hundred times greater than in single crystal silicon, the junctions which were implanted into the silicon substrate 5 diffuse by an insignificant amount during the anneal. Care is exercised to avoid boron penetration of the gate insulator.

Figure 10A:
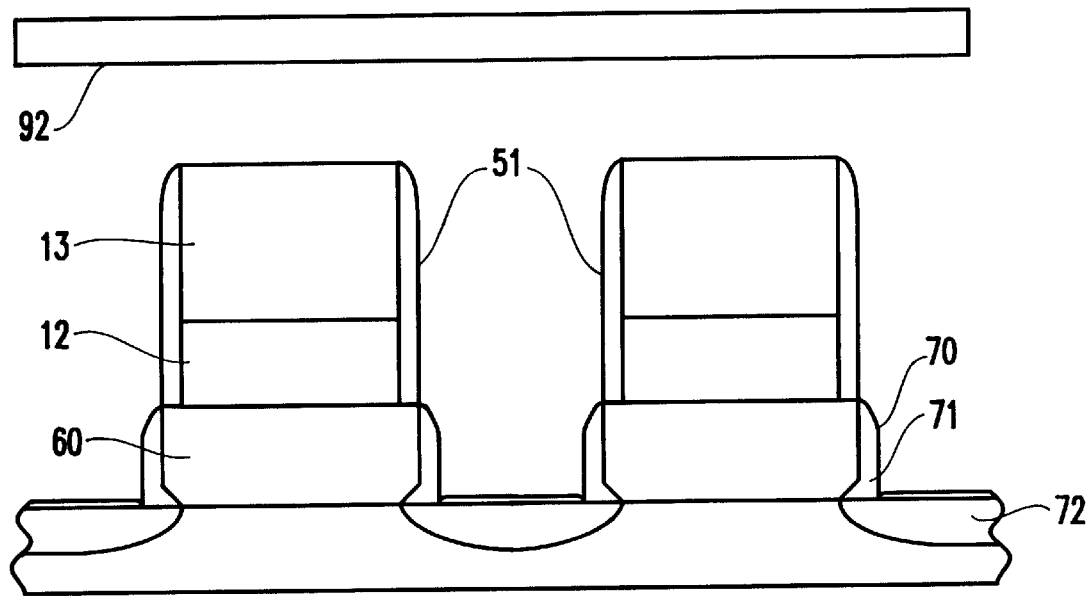
FIGS. 10A and 10B show the semiconductor structure after etching exposed portions of the polysilicon layer.
Figure 10B:
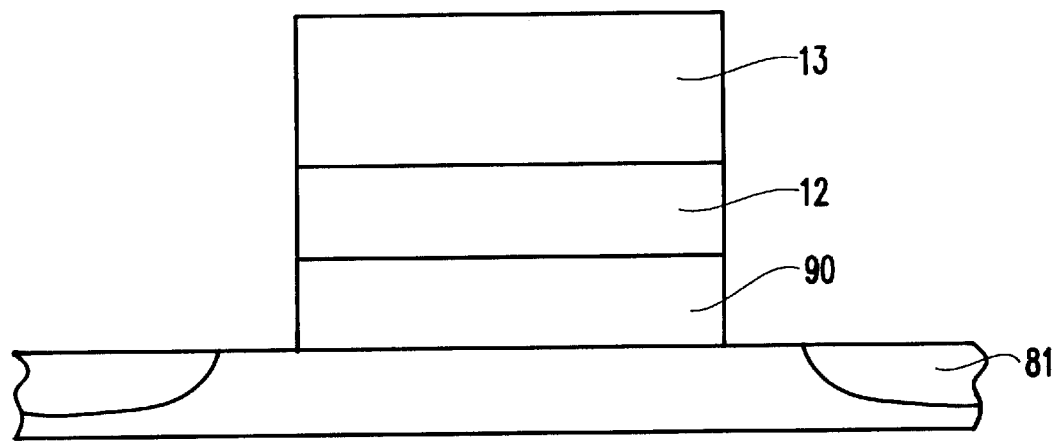

A support mask 92 (FIG. 10A) is then selectively placed over the array region to protect the array gates while the exposed polysilicon ledges of the support region are reactive ion etched selectively to gate oxide and silicon nitride (FIG. 10B). In an alternative embodiment, if array gate damage is not a concern, then the support mask 92 may be eliminated.

Figure 11A:
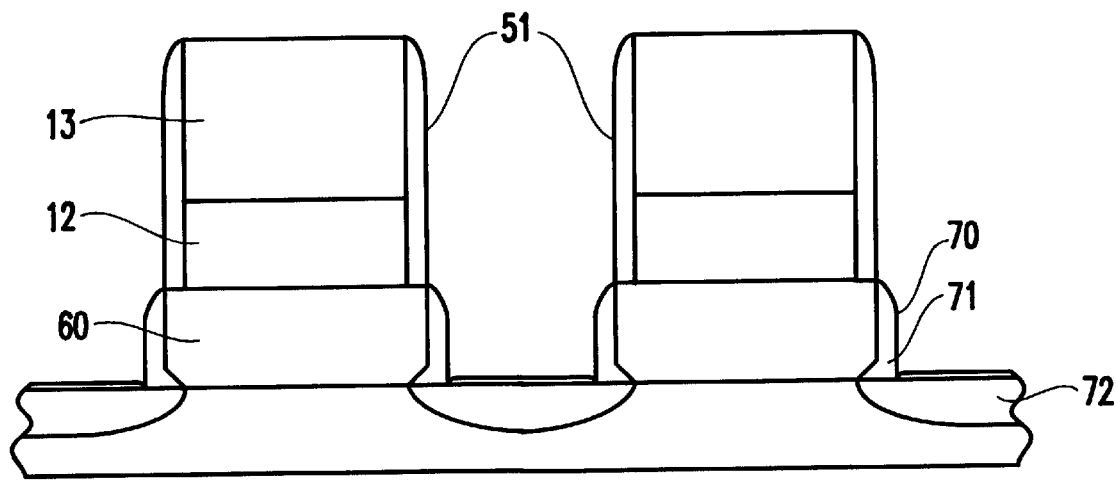
FIGS. 11A and 11B show the semiconductor structure after source-drain extensions implanting.
Figure 11B:
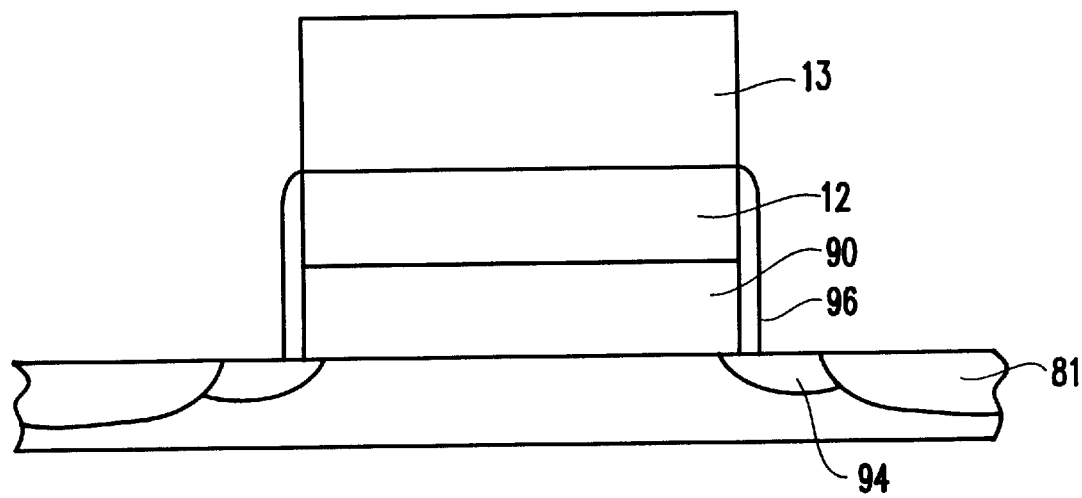

The support mask 92 is removed from the array region (FIG. 11A) and a sidewall oxidation layer 96 is grown in the support region (FIG. 11B). The source-drain extension regions 94 are then implanted in the support region in a well known manner such as a moderately low dose ($5 \times 10^{13}$–$5 \times 10^{14}$ cm$^{-2}$) and low energy implant (energy required depends on dopant species).

Figure 12:
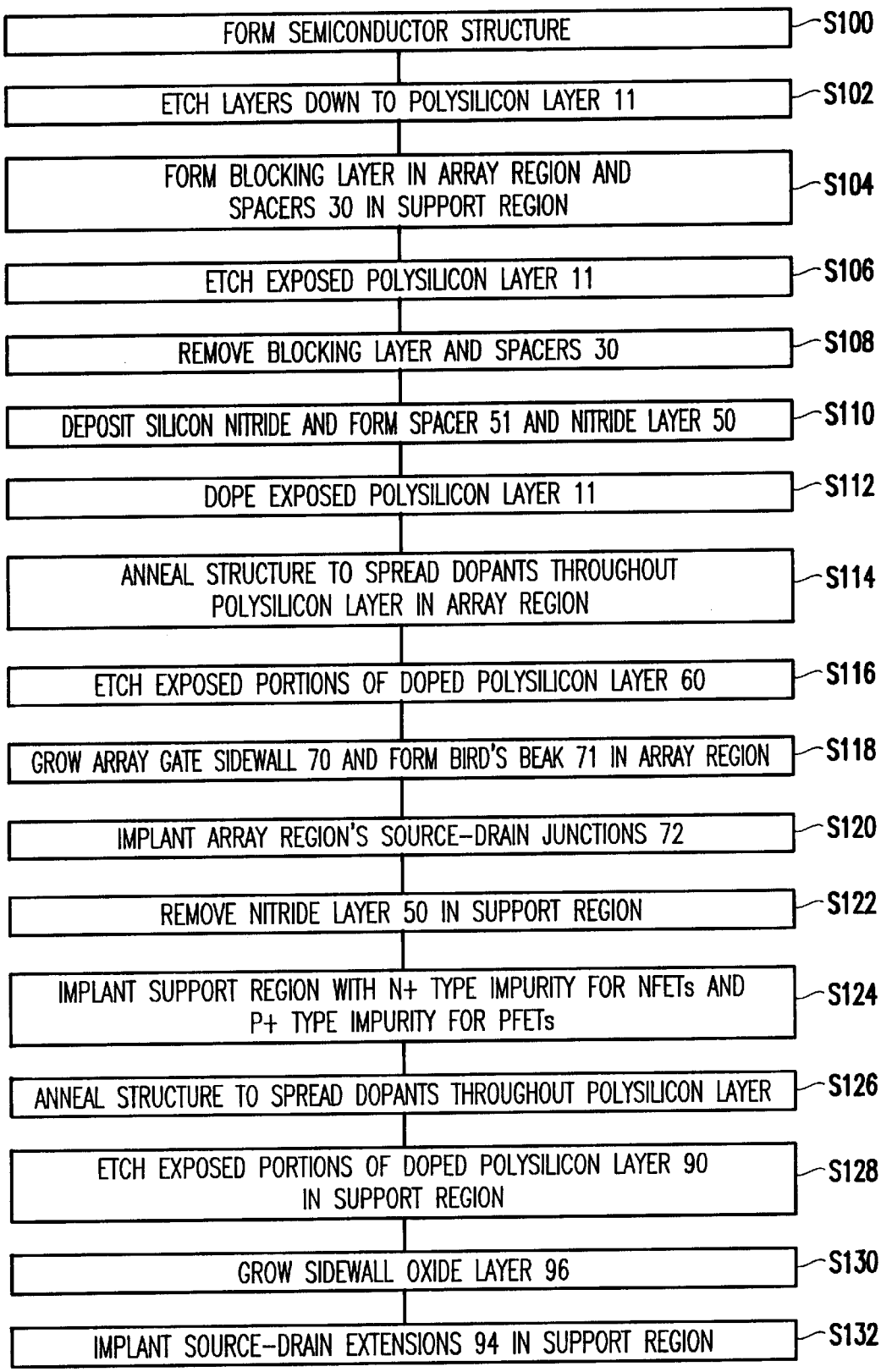
FIG. 12 is a flowchart showing steps of the invention.

FIG. 12 shows a flowchart showing steps of the present invention. While the flowchart shows a specific order of steps, this order is not necessary to the present invention. That is, one skilled in the art would understand that the invention can be practiced in other orders than the steps shown in FIG. 12.

In step S100, the semiconductor structure is formed. This may include the substrate 5, the gate oxide layer 10, the intrinsic polysilicon layer 11, the tungsten silicide layer 12, and the nitride cap 13. Then, in step S102, layers are etched down to the polysilicon layer 11. Subsequently, in step S104, a blocking layer is formed in the array region and spacers 30 are formed in the support region. The exposed polysilicon layer 11 (i.e., in the support region) is then etched in step S106 and the blocking layer and the spacers 30 are removed in step S108.

Subsequently, in step S110, silicon nitride is deposited over the structure and spacers 51 and nitride layer 50 are formed. The exposed polysilicon layer 11 (in the array region) is then doped in step S112. Then, in step S114, the structure is annealed to spread the dopants throughout the polysilicon layer 11 in the array region to form the doped polysilicon layer 60. Exposed portions of the doped polysilicon layer 60 are etched in step S116. Subsequently, in step S118, an array gate sidewall 70 is grown and a bird's beak 71 is formed in the array region. The array region's source-drain extensions 72 are then implanted in step S120. Then, in step S122, the nitride layer 50 is removed in the support region. In step S124, the support region is implanted with N+ type impurities for NFETs and P+ type impurities for PFETs. Then, in step S126, the structure is annealed to spread the dopants throughout the polysilicon layer 11. Exposed portions of the doped polysilicon layer 90 are etched in the support region in step S128. Subsequently, in step S130, the sidewall oxide layer 96 is grown. Source-drain extensions 94 are implanted in the support region in step S132 to complete the structure.

The resulting structure as discussed above forms the desired dual workfunction doping with the self-aligned insulating gate cap that reduces the GIDL by forming a thicker gate oxide layer at the gate conductor edges in the transistors of the array region. That is, the present invention achieves a dual workfunction requirement by applying either P+ or N+ doping to the gate conductor while at the same time creating a self-aligned cap on the gate conductor. The present invention further forms a thicker gate oxide layer on sidewalls in the array region by the formation of a bird's beak.

Still further, the present invention allows the formation of borderless diffusion contacts in the array region for high density. The dual workfunction gates in the support region allow surface channel MOSFETs for high performance.

An additional benefit provided by the invention is the decoupling of the thermal budget seen by the source-drain extensions of the support MOSFETs from the processing of the array MOSFETs. More particularly, since the support MOSFET source-drain diffusions are implanted after the formation of the bird's beak in the array MOSFETs, they avoid the relatively high thermal budget required to form the bird's beaks. Therefore, the junction depth of the support MOSFET source-drain extensions may be kept shallow by avoiding the thermal budget associated with the processing of the array MOSFET. Shallow support MOSFET source-drain extensions are desirable for providing improved scalability to shorter channel lengths and enhanced performance.

The bird's beak in the array also reduces gate to diffusion overlap capacitance, which results in reduced bitline capacitance and improved performance.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method for forming a semiconductor structure comprising:

providing a semiconductor wafer having a first region comprising first features, said first features being separated by a first spacing approximately equal to a minimum width, said semiconductor wafer further comprising a second region including second features having second feature sidewalls, said second features being separated by a second spacing;

forming dielectric spacers on said sidewalls leaving exposed horizontal surfaces in said second region; and selectively etching said exposed horizontal surfaces in said second region.

2. The method of claim 1, wherein said first region comprises an array region and said second region comprises a support region.

3. The method of claim 1, wherein said first features include a partial gate conductor stack.

4. The method of claim 3, wherein said partial gate conductor stack comprises a tungsten silicide layer and a silicon nitride cap.

5. The method of claim 3, wherein said first feature includes sidewalls, and the method further comprises:

implanting a first dopant in exposed horizontal surfaces of a semiconductive layer in said first region; and spreading said first dopant within said semiconductive layer to form a first doped semiconductive layer underlying said first features.

6. The method of claim 5, wherein said first dopant is selected from the group consisting of an N type dopant and a P type dopant.

7. The method of claim 5, wherein said spreading comprises a rapid thermal anneal.

8. The method of claim 5, further comprising anisotropically etching said first doped semiconductive layer to form a full gate conductor stack in said first region.

9. A method for forming a semiconductor structure comprising:

providing a semiconductor wafer having a first region comprising first features, said first features being separated by a first spacing approximately equal to a minimum width, said semiconductor wafer further comprising a second region including second features having second feature sidewalls, said second features being separated by a second spacing, said second spacing being larger than said minimum width;

depositing a dielectric material over said semiconductor wafer, said dielectric material having a thickness such that said first spacing is substantially filled by said dielectric material and said dielectric material forms a layer conformally over and between said second features;

anisotropically etching horizontal areas of said dielectric material so that said first spacing remains substantially filled with said dielectric material and so that spacers of said dielectric material remain on said sidewalls leaving exposed horizontal surfaces of said second region; and selectively etching said exposed horizontal surfaces in said second region.

10. The method of claim 9, wherein said first region comprises an array region and said second region comprises a support region.

11. The method of claim 9, wherein said first features include a partial gate conductor stack.

12. The method of claim 11, wherein said partial gate conductor stack comprises a tungsten silicide layer and a silicon nitride cap.

13. A method of fabricating a semiconductor structure comprising:

providing a substrate having a first region and a second region;

depositing a gate dielectric layer over said substrate in said first region;

depositing a semiconductive layer over said gate dielectric layer in said first region;

forming a plurality of partial gate stacks over said semiconductive layer in said first region, wherein each of said partial gate stacks are separated by a first spacing approximately equal to a minimum width;

forming a plurality of second features having second feature sidewalls in said second region, said second features being separated by a second spacing, said second spacing being larger than said minimum width;

depositing a dielectric material over said semiconductor wafer, said dielectric material having a thickness such that said first spacing is substantially filled by said dielectric material and said dielectric material forms a layer conformally over and between said second features;

anisotropically etching horizontal areas of said dielectric material so that said first spacing remains substantially filled with said dielectric material and so that spacers of said dielectric material remain on said sidewalls leaving exposed horizontal surfaces of said second region; and selectively etching said exposed horizontal surfaces in said second region.

14. The method of claim 13, wherein the forming of a plurality of partial gate stacks further comprises:

depositing a tungsten silicide layer;

depositing a silicon nitride layer; and patterning and etching through said nitride layer and said tungsten silicide layer down to at least said semiconductive layer.

15. The method of claim 14, wherein said semiconductive layer comprises polysilicon.

16. The method of claim 14, wherein said first feature includes sidewalls, and the method further comprises:

removing said dielectric material to expose said first feature sidewalls and horizontal surfaces of said semiconductive layer in said first region;

forming spacers on said first feature sidewalls;

implanting a first dopant in exposed horizontal surfaces of said semiconductive layer in said first region; and spreading said first dopant within said semiconductive layer to form a first doped semiconductive layer underlying said first features.

17. The method of claim 15, wherein said first feature includes sidewalls, and the method further comprises:

removing said dielectric material to expose said first feature sidewalls and horizontal surfaces of said semiconductive layer in said first region;

forming spacers on said first feature sidewalls;

implanting a first dopant in exposed horizontal surfaces of said semiconductive layer in said first region; and spreading said first dopant within said semiconductive layer to form a first doped semiconductive layer underlying said first features.

18. The method of claim 17, wherein said first dopant is selected from the group consisting of an N type dopant and a P type dopant.

19. The method of claim 17, wherein said spreading comprises a rapid thermal anneal.

20. The method of claim 17, further comprising anisotropically etching said first doped semiconductive layer to form a full gate conductor stack in said first region.

* * * * *